United States Patent
Grodzki et al.

(10) Patent No.: US 12,385,996 B2
(45) Date of Patent: Aug. 12, 2025

(54) GENERIC AND DYNAMIC EXCITATION PULSE FOR B0 COMPENSATION

(71) Applicant: Siemens Healthineers AG, Erlangen (DE)

(72) Inventors: David Grodzki, Erlangen (DE); Rainer Schneider, Höchstadt (DE)

(73) Assignee: Siemens Healthineers AG, Forchheim (DE)

( * ) Notice: Subject to any disclaimer, the term of this patent is extended or adjusted under 35 U.S.C. 154(b) by 190 days.

(21) Appl. No.: 18/226,450

(22) Filed: Jul. 26, 2023

(65) Prior Publication Data
US 2024/0036132 A1  Feb. 1, 2024

(30) Foreign Application Priority Data
Jul. 27, 2022  (DE) .................. 10 2022 207 681.8

(51) Int. Cl.
*G01R 33/385* (2006.01)
*G01R 33/36* (2006.01)
(Continued)

(52) U.S. Cl.
CPC ....... *G01R 33/385* (2013.01); *G01R 33/3607* (2013.01); *G01R 33/443* (2013.01);
(Continued)

(58) Field of Classification Search
CPC .................. G01R 33/3607; G01R 33/385; G01R 33/443; G01R 33/4833; G01R 33/5608; G01R 33/5673
See application file for complete search history.

(56) References Cited

U.S. PATENT DOCUMENTS

| 2011/0172515 A1* | 7/2011 | Fautz | G01R 33/56 600/410 |
| 2015/0309133 A1* | 10/2015 | Sun | G01R 33/5614 324/309 |

(Continued)

FOREIGN PATENT DOCUMENTS

DE        102020202830 A1     9/2021

OTHER PUBLICATIONS

Tanabe, Koji et al.: "Fat Suppression with Short Inversion Time Inversion-Recovery and Chemical-Shift Selective Saturation: A Dual STIR-CHESS Combination Prepulse for Turbo Spin Echo Pulse Sequences," Journal of Magnetic Resonance Imaging: An Official Journal of the International Society for Magnetic Resonance in Medicine, 2010, 31. Jg., Nr. 5, pp. 1277-1281.
(Continued)

*Primary Examiner* — Gregory H Curran
(74) *Attorney, Agent, or Firm* — Banner & Witcoff Ltd.

(57) ABSTRACT

Techniques are provided for operating a magnetic resonance tomography unit. The operation includes determining a B0 field map, determining an excitation of the nuclear spins that is to be achieved, and determining a spectrally selective, generic excitation pulse for transmission by the transmitter via the antenna in dependence upon the B0 field map. The generic excitation pulse is designed to generate the excitation of the nuclear spins that is to be achieved in the patient except for local differences. The operation also comprises determining a spectrally selective, dynamic excitation pulse for transmission by the transmitter via the antenna in dependence upon the B0 field map. The excitation pulse is designed so as to compensate the local differences and thus to generate the excitation of the nuclear spins that is to be achieved in the patient, and outputting the excitation pulse via the antenna.

12 Claims, 3 Drawing Sheets

Figure 1:
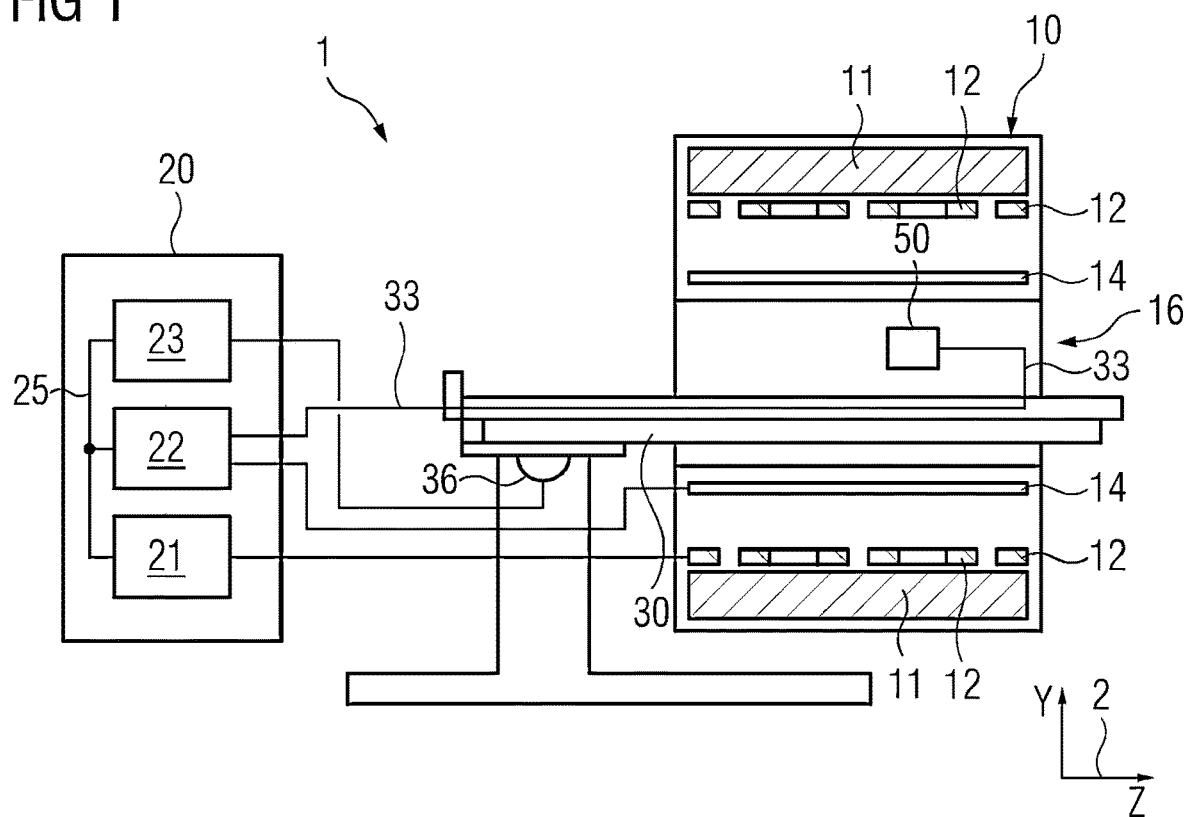

(51) Int. Cl.
  *G01R 33/44* (2006.01)
  *G01R 33/483* (2006.01)
  *G01R 33/56* (2006.01)
  *G01R 33/567* (2006.01)
(52) U.S. Cl.
  CPC ..... *G01R 33/4833* (2013.01); *G01R 33/5608* (2013.01); *G01R 33/5673* (2013.01)

(56) References Cited

U.S. PATENT DOCUMENTS

2016/0291111 A1   10/2016   Pfeuffer et al.
2019/0025390 A1*  1/2019    Hwang ................ G01R 33/543
2021/0278492 A1   9/2021    Grodzki et al.

OTHER PUBLICATIONS

Heilman, Jeremiah A. et al: "Parallel Excitation for B-Field Insensitive Fatsaturation Preparation," Magnetic resonance in medicine, 2012, 68. Jg., Nr. 2, pp. 631-638.

* cited by examiner

GENERIC AND DYNAMIC EXCITATION PULSE FOR B0 COMPENSATION

CROSS-REFERENCE TO RELATED APPLICATIONS

The present application claims priority to and the benefit of Germany patent application no. 10 2022 207 681.8, filed on Jul. 27, 2022, the contents of which are incorporated herein by reference in their entirety.

TECHNICAL FIELD

The disclosure relates to a magnetic resonance tomography unit and a method for operating the magnetic resonance tomography unit. In the method, an excitation pulse is determined and transmitted so as to excite nuclear spins in dependence upon a B0 field map and a gradient pulse.

BACKGROUND

Magnetic resonance tomography units are imaging apparatuses that, so as to map an examination object, align nuclear spins of the examination object with a strong external magnetic field B0. By means of an alternating magnetic field, magnetic resonance tomography units excite said nuclear spins to precession about this alignment. The precession or return of the spins from this excited state to a lower energy state in turn generates in response an alternating magnetic field which is received via antennas.

With the aid of magnetic gradient fields, a spatial encoding is impressed on the signals, which subsequently enables the received signal to be assigned to a volume element. The received signal is then evaluated and a three-dimensional image representation of the examination object is provided.

In this case, the quality of the generated images is greatly dependent upon the homogeneity of the magnetic field that aligns the nuclear spins. It is known to improve the homogeneity of the static magnetic field using shim coils and, when designing the gradient pulses, to take into consideration dynamic effects due to eddy currents.

SUMMARY

It is thus an object of the present disclosure to perform the magnetic resonance imaging via a magnetic resonance tomography unit in an improved and more cost-effective manner. This object is achieved by the various embodiments as described herein, including the claims.

The magnetic resonance tomography unit described herein may be alternative referred to herein as a magnetic resonance imaging device, and comprises a controller. The controller is configured to control image capturing using the magnetic resonance tomography unit, and to optionally also perform image reconstruction. Such a controller may be further configured to perform the below described method in accordance with the disclosure as part of a magnetic resonance tomography unit.

Furthermore, the magnetic resonance tomography unit described herein has a field magnet so as to generate a static homogeneous magnetic field B0. The field magnet is preferably a superconducting magnet, however, in the case of lower field strengths less than 1 T, 0.5 T or 0.1 T electromagnets having resistive winding or permanent magnets are also conceivable.

The magnetic resonance tomography unit has gradient coils so as to generate magnetic field gradients in three-dimensional space, typically referred to as Gx, Gy, Gz, and a gradient controller so as to generate the dynamic currents that are required for the gradient fields. The gradient coils are typically realized as pairs in the form of a Helmholtz coil pair or as saddle coils.

The magnetic resonance tomography unit has a transmitter and an antenna to generate an alternating magnetic field B1 to excite nuclear spins in a patient. The transmitter is configured to transmit an excitation pulse that can vary temporally in amplitude, phase, and frequency. For this purpose, a signal is usually provided in the basic band that can be brought to the Larmor frequency via mixing, and may be temporally varied in frequency and/or amplitude by modulation. The resulting radio frequency (RF) signal is subsequently amplified by a power stage of the transmitter and radiated into the patient via an antenna or transmitting antenna, for example a body coil or also local coil, as a predominantly RF alternating magnetic field B1.

Fundamentally, it is also conceivable in accordance with the disclosure to use a single transmitting channel, and to optimize the spectrally selective dynamic excitation pulse only in terms of time in accordance with, for example, an exponentially-abating eddy current. The spatial components may be compensated in this case in part by a broader spectral distribution.

However the transmitting antenna for example may also be designed for parallel transmission (pTx). In other words, the transmitting antenna may be configured for instance as a spatial arrangement of a number of transmitting antennas, which when controlled appropriately, transmit spatially-encoded RF pulses, in other words dynamic excitation pulses.

Furthermore, the magnetic resonance tomography unit has a receiving antenna, e.g. a local coil, and a receiver for receiving a magnetic resonance signal from the patient. The receiver prepares the received magnetic resonance signals for an image reconstruction.

In the method mentioned above in the introduction for operating a magnetic resonance tomography unit in accordance with the disclosure, the controller determines in one step a B0 field map, in other words data regarding spatial variations of the B0 field in the acquisition area of the magnetic resonance tomography unit. In this case, in contrast to the B1 field, a magnetic field is regarded as a B0 field, said magnetic field only having temporal variations with frequencies that are considerably less than the Larmor frequency, for example by the factor 10, 50, or greater. The B0 field map can be stored in a storage device of the controller if this B0 field map has, for example, already been determined during production by measuring using a field camera or by calculating a field distribution for the magnetic resonance tomography unit. However, it is also possible that the controller determines these at the commencement of a sequence by a magnetic resonance measurement or by simulation, for example, while taking into consideration the position and other characteristics of the patient or settings of the magnetic resonance tomography unit such as shim currents through shim coils.

In a further step, the controller determines an excitation of the nuclear spins that is to be achieved, e.g. in a volume that is to be examined Usually, the excitation of the nuclear spins that is to be achieved depends upon the sequence used and the partial step of the sequence that is to be currently performed. Examples for the special excitations are disclosed in further detail below. Typically, a desired flip angle of the nuclear spin such as 90 degrees or 180 degrees is specified. In this case, this can be a selective excitation of determined nuclei or nuclei of atoms in special bonds with different Larmor frequencies. Additional examples of this are disclosed in further detail below.

In a further step, the controller determines a spectrally selective, generic excitation pulse for transmission by the transmitter via the antenna, wherein the excitation pulse is configured to achieve the previously-determined excitation. This is understood to mean that the excitation of the nuclear spins that are to be excited does not deviate at any place of the volume that is to be detected, for example a layer in the body of the patient that is to be mapped as a local or punctual difference, by more than any suitable proportion such as e.g. 20%, 10%, 5%, 1%, 0.1%, etc. from the excitation that is to be achieved. When determining the excitation pulse, the B0 field map is taken into consideration, as well as gradient fields that may be present in the volume to be detected. The gradient fields may also be considered in this case as a component of the B0 field, and may be included in the B0 field map. It is possible, for example, using an optimization method such as LSR (least square root method of the minimum quadratic deviation) by means of Bloch equations to determine the spin excitation in dependence upon the B0 field map and the excitation pulse, and to minimize deviations from the determined excitation until these deviations are below a predetermined deviation. Optionally, it is also possible, for example, to store parameterized templates for excitation pulses, in which the parameters are optimized, or also tables having predetermined excitation pulses, from which one with minimal deviation is selected.

The spectrally selective but generic excitation pulse is an excitation pulse that is designed to generate the excitation of the nuclear spins that is to be achieved in the patient except for the above disclosed local differences. The generic excitation pulse is not a dynamic excitation pulse. In other words, for example, it is therefore not based on the pTx method. It can be designed, for example, as a usual saturation pulse that corresponds to the particular application, in other words for example as a Gaussian-shaped spectral saturation pulse.

The excitation pulses are spectrally selective excitation pulses. Spectrally selected is regarded in terms of the disclosure to be that the excitation pulse excites the different types of nuclear spins or bond types in a predetermined manner only on the basis of different Larmor frequencies of the nuclear spins, caused by different nuclei, e.g. by identical nuclei in different chemical bonds. In other words, the excitation pulse causes a predetermined change of the alignment of the nuclear spins in the B0 magnetic field. For example, it is possible to provide that, due to the spectrally selective excitation pulse nuclear spins in one bond type, a full alignment opposite to the magnetic field direction or a flip angle of 90 degrees is assumed, while the nuclear spins in another bond type do not experience a change in the alignment. In this case, the Larmor frequency can differ as a result of the different bonds by less than 100 per mil, 50 per mil, 10 per mil, 5 per mil, 1 per mil, etc.

In a further step, a spectrally selective, dynamic excitation pulse is determined for transmission by the transmitter via the antenna in dependence upon the B0 field map. In this case, the spectrally selective, dynamic excitation pulse is designed so as to compensate the local differences that still exist after the excitation by means of the spectrally selective, but generic, excitation pulse.

In an embodiment, the spectrally selective, dynamic excitation pulse is determined such that the local deviations from the excitation of the nuclear spins that is to be achieved are less than any suitable proportion such as e.g. 10%, 5%, 1%, 0.1%, etc. In this case, the determination may be fundamentally performed as already described above, with a detailed embodiment being further disclosed below.

The spectrally selective, generic excitation pulse and the spectrally selective, dynamic excitation pulse can consequently also be understood as sub-pulses of a combined spectrally selective excitation pulse. In other words, a spectrally selective excitation pulse that comprises a first, generic, or static sub-pulse and a second dynamic sub-pulse is thus determined and output.

In a further step of the method in accordance with the disclosure, the controller outputs, in accordance with the sequence, the determined excitation pulses via the transmitter and the antenna. Output in accordance with the sequence is to be understood in this case to mean that the excitation pulses are transmitted at a predetermined point in time as specified by the sequence. This can comprise e.g. a temporally predetermined specification with regard to the gradient fields.

In an advantageous manner, it is possible using the magnetic resonance tomography unit in accordance with the embodiments deprescribed herein to take into consideration and compensate spatial variations of the B0 field in the excitation pulses. In this manner, it is possible, depending upon each application, to improve the image quality and/or to reduce the outlay for the compensation or prevention of B0 field deviations, such as for example active or passive shimming. Alternatively or in addition thereto, it is also possible to reduce the electromagnetic loading (SAR) for the patient or, in the case of the same loading, to improve the image quality.

In addition, in contrast to known methods, it is possible by means of the preceding spectrally selective, generic excitation pulse to advantageously reduce the duration and amplitude of the spectrally selective, dynamic excitation pulse, and consequently to reduce the requirements for the corresponding power stages or RF amplifier (RFPA=radio frequency power amplifier). This renders it possible to also perform the method using suitable older or more cost-effective magnetic resonance tomography units.

A large portion of the previously known components of the magnetic resonance tomography unit can be realized in whole or in part in the form of software modules in a processor of an appropriate computer system, for example in the controller of the magnetic resonance tomography unit. A largely software-based realization has the advantage that computer systems already in use can be retrofitted in a simple manner by a software update to function in the manner according to the embodiments of the disclosure. In this respect, the object is also achieved by a corresponding computer program product having a computer program which can be loaded directly into a computer system, having program sections in order to perform the steps of the method in accordance with the disclosure, at least the steps 310/410, 330/430, 340/440, 350/450 may be performed by a computer, if the program is executed in the computer system. Such a computer program product can comprise, in addition to the computer program, appropriate additional components, such as for example documentation and/or additional components, as well as hardware components, such as for example hardware keys (dongles, etc.) for using the software.

For the transport to the computer system or to the controller and/or for storing on or in the computer system or the controller, it is possible to use a computer-readable medium, for example a memory stick, a hard drive, or another suitable transportable or permanently installed data storage medium, on which are stored the program steps of the computer program that can be read and executed by the computer system. The computer system can have for this purpose e.g. one or a plurality of microprocessors or the like that cooperate with one another.

Further advantageous embodiments and developments of the disclosure are disclosed in the dependent claims and the description below, wherein the claims of one claim category can also be developed in a similar manner to the claims and description parts to another claim category and, for instance, also individual features of different exemplary embodiments or variants can be combined to form new exemplary embodiments or variants.

The method may have in addition a step in which a B1 field map is determined. The B1 field map indicates variations in the amplitude of the radio frequency magnetic B1 alternating field which is generated when an excitation pulse is transmitted by the transmitter via the antenna. This can be caused, for example, by the geometry of the antenna or also by the interaction with the patient, for example attenuation or absorption in the body.

A B1 field map can take place, for example, by exciting and reading a phantom in advance or also with the patient, for example by phase-sensitive mapping or by a Bloch-Siegert shift. The step of determining a spectrally selective excitation pulse takes place in dependence upon the B1 field map. For example, an amplitude of the B1 field that is recognized in the B1 field map and locally reduced in one area can be compensated by a higher amplitude of the excitation signal in this area, in the case of a multi-channel transmitter, or by a longer duration of the excitation signal. If the range of B1 field variation correlates spatially with a different B0 field due to gradients or B0 field variations, it is also possible due to different Larmor frequencies to also use a variation of the amplitude for corresponding spectral components of the excitation pulse so as to spatially homogenize the excitation by the excitation pulse due to different Larmor frequencies.

In an advantageous manner, it is thus also possible by means of the excitation pulse to reduce an inhomogeneity in the maps created, said inhomogeneity being generated by B1 variation.

The spectrally selective, generic excitation pulse and/or the spectrally selective, dynamic excitation pulse may be configured as excitation pulses so as to achieve a saturation of the nuclear spins of a first bond type in the volume that is to be examined. In this case, depending upon the sequence, a predetermined flip angle for saturation may differ, for example, to correspond to the value of 90 degrees or 180 degrees. However, a flip angle of 110° may be particularly advantageous. In this case, however, deviations of up to ±10 degrees or ±20 degrees can be tolerated. In this case, it is regarded as saturation of the nuclear spins if more than 80%, 90%, 95% or 99% of the nuclear spins of the first bond type assume the predetermined flip angle or in the tolerance range about the flip angle.

Masking saturation of the nuclear spins of a first type of nucleus or a first type of bond by saturation pulses is a common technique to mask, for example, fat in the imaging. The technique is, however, disturbed by B0 field fluctuations, for example due to different tissue boundaries with different permeability. In an advantageous manner, the use of spectrally selective, generic and dynamic excitation pulses as a combined saturation pulse is therefore a possibility for improving the image quality when applying suppression by saturation.

The spectrally selective, generic excitation pulse and the spectrally selective, dynamic excitation pulse may be configured to achieve different predetermined target magnetizations for nuclear spins with at least two predetermined different Larmor frequencies. It is possible e.g. by adapting the amplitude for different frequency components of the spectrally selective, dynamic excitation pulse, in other words the spectral energy distribution, to set specifically predetermined target magnetizations or flip angles for nuclear spins with different Larmor frequencies, in other words for example with different first and second chemical bonds. One example is a saturation pulse with which, as previously, a saturation for a first bond type is set, whereas for the other second bond type the flip angle does not change. However, it would also be conceivable to simultaneously change the flip angles of both bond types by different amounts to thus, in an advantageous manner, accelerate the method and/or reduce the SAR loading.

In the step of determining a B0 field map, the B0 field map may be determined e.g. in dependence upon B0 deviations that are induced by the patient. The B0 field map may be determined in advance for example by an MR measurement in the absence of the patient. It is, however, also possible with the aid of parameters of the patient, such as for example height, weight, and/or position, to model its effects on the homogeneous B0 field in an automatic calculation by the controller or to retrieve them from a database. The B0 field map that is determined in this manner then renders it possible using the method in accordance with the disclosure to compensate the effects of these B0 variations by the patient, and to improve for example the suppression of fat by saturating the fat in the map that is generated.

In a further step, the controller may additionally determine a gradient pulse. This usually depends upon the sequence used and therein in turn upon the position of the volume elements that are to be detected. The gradient pulse may be obtained from a stored library of the controller and adapted via parameters. A calculation or an optimization method based on the fields that are to be achieved by means of the Biot-Savart law are also conceivable. In this case, it is also possible to take into consideration dynamic effects, such as eddy currents in the magnetic resonance tomography unit. The result is a predetermined temporal progression of currents through the gradient coils.

The determined gradient pulse is converted in a further step via the gradient controller into corresponding currents through the gradient coils and, as a result, generates the desired gradient fields.

In an advantageous manner, it is possible using the magnetic resonance tomography unit in accordance with the embodiments described herein to take into consideration and to compensate for dynamic effects of the gradient pulses in the excitation pulses. In this manner, it is possible depending upon each application to improve the image quality or reduce the outlay for the compensation or prevention of eddy currents. Alternatively or in addition thereto, it is also possible to reduce the electromagnetic loading (SAR) for the patient or in the case of the same loading to improve the image quality.

At least one physiological parameter of the patient may be acquired. This can be, for example, weight, dimension, position on the support, fat percentage, etc. The physiological parameters are acquired for example by user input on an input device by inputting the parameter or by selecting from predetermined templates. However, it is also possible that the parameter is determined automatically by sensors, such as a camera, weight or pressure sensors, or via a quick magnetic resonance measurement by the controller.

In the step of determining the excitation pulse (e.g. the spectrally selective generic and dynamic excitation pulses individually, or the combined excitation pulse, which comprises both the spectrally selective generic and dynamic excitation pulse as noted herein), this parameter may e.g. be taken into consideration by the controller. For example, the field strength and the permeability which vary due to body weight and composition of the body can be used in the Bloch equations. In this manner, the result of the optimization method then depends upon the physiological parameter.

As a result, the embodiments described herein are advantageously able to optimize the image quality also individually by taking into consideration characteristics of the patient.

The excitation that is to be achieved may be a spatially homogeneous fat saturation. In the case of magnetic resonance mapping, body fat is the most frequent disturbing substance since body fat also has a high proton density and is often spatially closely intertwined with other organs that are to be examined. Fat may be fundamentally easily suppressed by saturation pulses owing to the somewhat other nuclear spins of the protons in the chemical bonds of hydrocarbons in contrast to water. However, owing to the small frequency differences in the Larmor frequency, even small changes in the magnetic field, such as are also caused dynamically due to eddy currents, lead to poor image quality. The embodiments described herein achieve an improved image precisely in the case of fat saturation without costly hardware changes.

The transmitter of the magnetic resonance tomography unit may have a plurality of transmitting channels. In this case, outlets of the transmitter at which an excitation pulse for supplying an antenna may already be provided are regarded as transmitting channels, wherein the signals of the transmitting channels differ in amplitude, spectral power distribution, and/or phase. In this case, in terms of the disclosure, a vector is also regarded as an excitation pulse which comprises a plurality of excitation signals for individual transmitting channels which, in the case of temporally coordinated transmissions via the antenna, bring about the excitation of the nuclear spins to be achieved in the examination volume. The antenna or transmitting antenna may be an antenna array having a plurality of transmitting elements, wherein the signal outlets are each in signal connection with at least one transmitting element to generate an alternating magnetic field. This can be for example an individual element or a plurality of elements of a birdcage antenna or a plurality of antenna coils of a local coil array. In other words, the transmitting antenna may be configured to perform parallel transmission (pTx). In other words, the transmitting antenna may be configured as a spatial arrangement of a number of transmitting antennas which, when controlled appropriately, transmit spatially encoded RF pulses, in other words dynamic excitation pulses.

In the step of transmitting the excitation pulse, it is thus possible to achieve a predetermined spatial distribution of the excitation as an additional degree of freedom due to interference of the signals of the plurality of transmitting channels via a plurality of transmitting elements of the antenna, which is set in the case of the step of determining the excitation pulse by variation of the phase and amplitude.

It is thus possible in an advantageous manner to improve the homogeneity of the excitation in the case of an even smaller SAR loading.

The method may comprise, in addition a regional saturation by means of a regionally selective, generic excitation pulse and/or a regionally selective, dynamic excitation pulse. In addition to the spectral saturation, essentially all nuclear spins are as a result saturated in at least a predetermined region, and not only nuclei in specific bonds. As a result, it is possible in addition to saturate entire regions which would otherwise have a negative influence on the imaging.

In the step of determining a spectrally selective, dynamic excitation pulse, the excitation that is to be expected may be analyzed by the spectrally selective, generic excitation pulse, e.g. via a Bloch simulation. The spectrally selective, dynamic excitation pulse is determined in dependence upon this analysis. In other words, the spectrally selective, dynamic excitation pulse is determined by the controller, e.g. by means of Bloch simulation, based on the excitation or magnetization, which is expected after the spectrally selective, generic excitation pulse, and the excitation that is to be achieved.

Since the spectrally selective, generic excitation pulse in this variant may be determined for example by means of a comparatively simple RMS method, a simulation in this case is generally only necessary for the spectrally selective, dynamic excitation pulse. As a result, the computational outlay can advantageously be kept low in comparison to the variant below.

Alternatively, the steps for determining a spectrally selective, generic excitation pulse and determining a spectrally selective, dynamic excitation pulse may be performed in a common simulation. In this case, the spectrally selective, generic excitation pulse flows into this simulation e.g. as a static component. In the case of this computationally costlier variant, it is advantageously possible to also determine the spectrally selective, generic excitation pulse in dependence upon the spectrally selective, dynamic excitation pulse. As a result, a comparatively better imaging or a low loading (SAR) of the patient can be achieved.

BRIEF DESCRIPTION OF THE DRAWINGS/FIGURES

Figure 2:
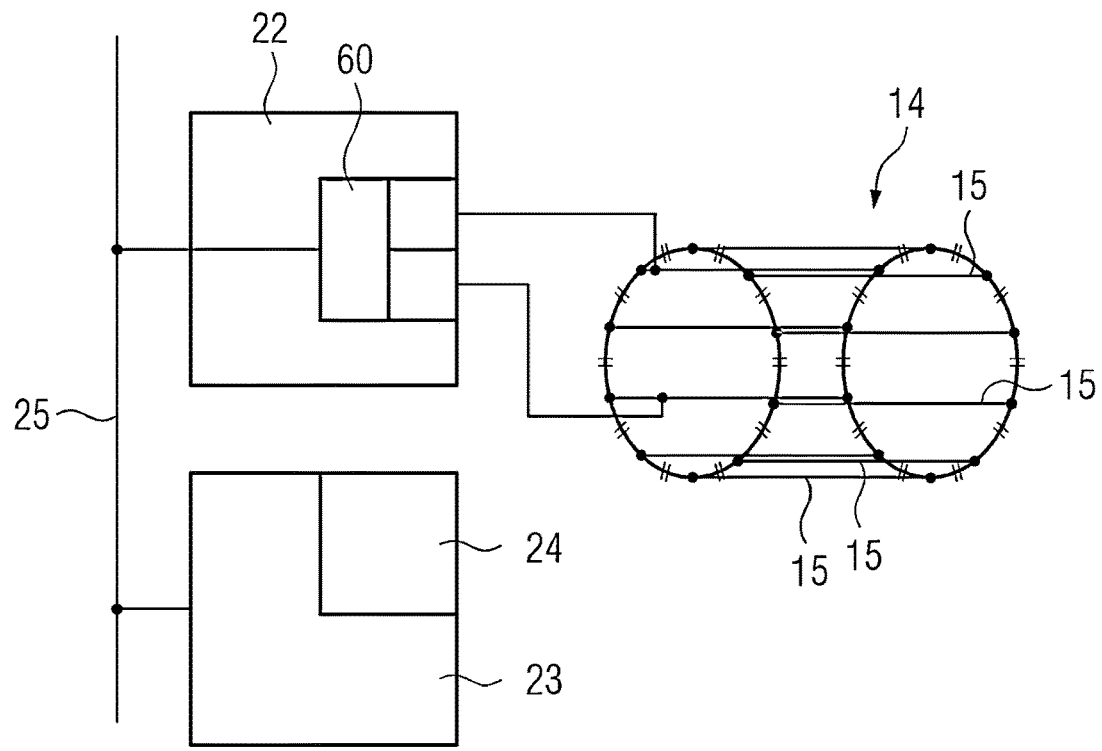
Figure 3:
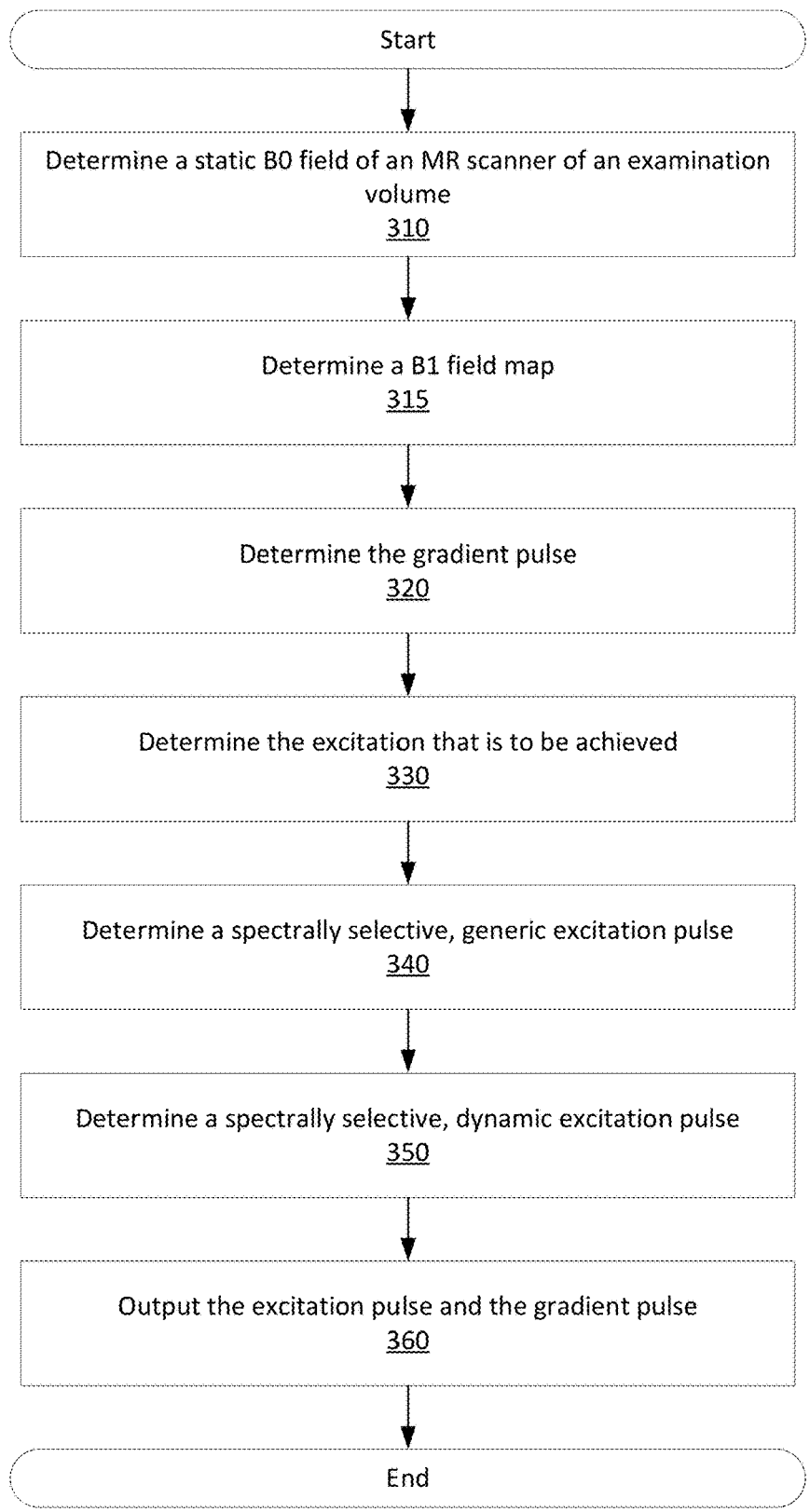
Figure 4:
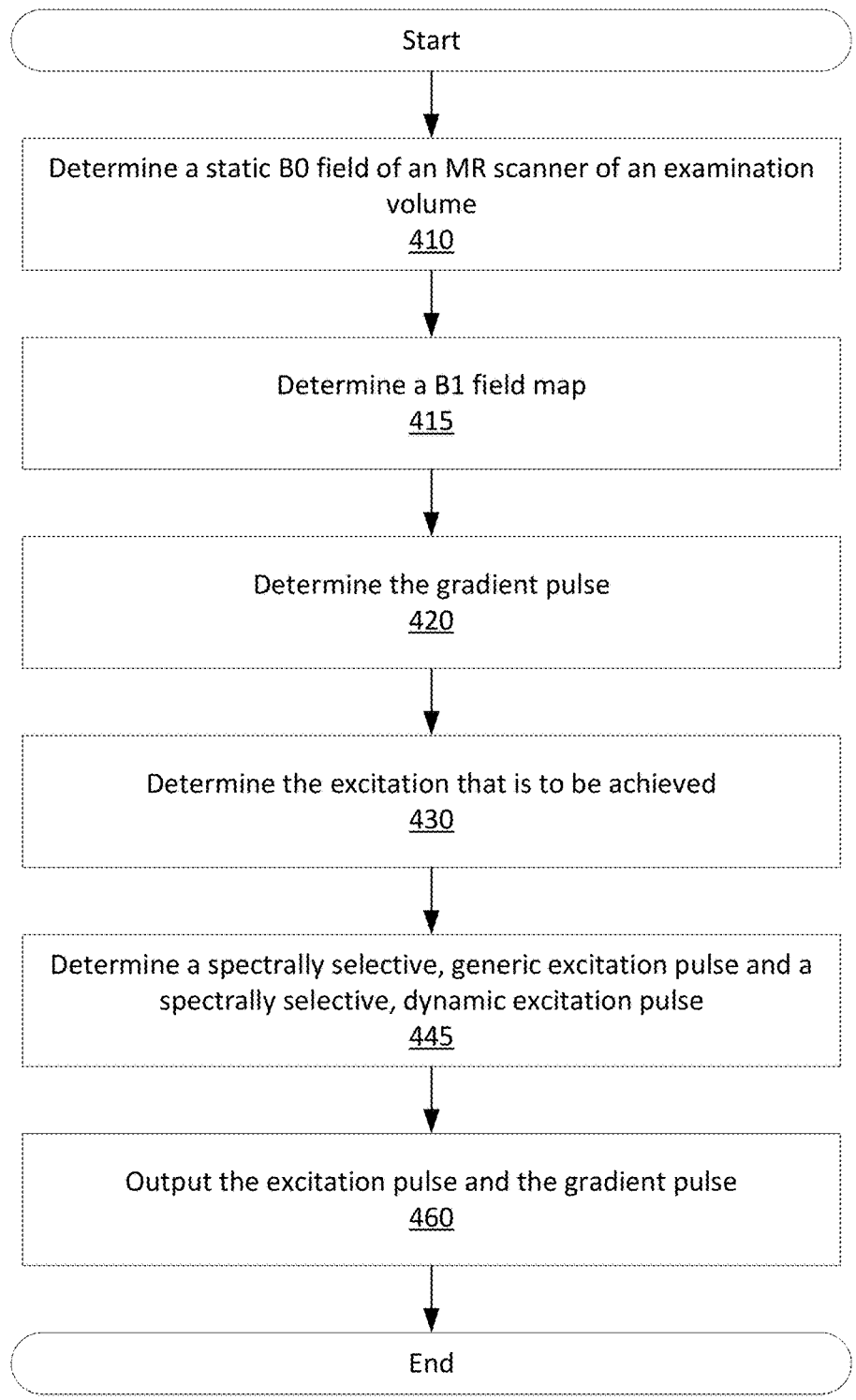

The disclosure is explained again in detail below with reference to the attached figures with the aid of exemplary embodiments. In this case, identical components in the different figures are provided with identical reference characters. The figures are in general not to scale. In the drawings:

FIG. 1 shows a schematic overview representation of an exemplary embodiment of a magnetic resonance tomography unit in accordance with the disclosure, FIG. 2 shows a schematic representation of a transmitter and an antenna of an exemplary embodiment of a magnetic resonance tomography unit in accordance with the disclosure, FIG. 3 shows a flow diagram of an exemplary embodiment of a method in accordance with the disclosure and FIG. 4 shows a flow diagram of a further exemplary embodiment of a method in accordance with the disclosure.

DETAILED DESCRIPTION

FIG. 1 shows a schematic overview representation of an exemplary embodiment of a magnetic resonance tomography unit 1 in accordance with the disclosure, which is designed so as to perform a method in accordance with the disclosure.

The magnetic resonance tomography unit 1 in comprises a magnet unit 10, which has a field magnet 11 that generates a static magnetic field B0 to align nuclear spins of samples or of the patient in a recording area. The recording area is characterized by an extremely homogeneous static magnetic field B0, wherein the homogeneity relates to the magnetic field strength or magnitude. The recording area is nearly spherical and arranged in a patient tunnel 16, which extends in a lengthwise direction 2 through the magnet unit 10. A patient support 30 may be moved in the patient tunnel 16 by the drive unit 36. The field magnet 11 is usually a superconducting magnet, which may provide magnetic fields with a magnetic flux density of up to 3 T, and in the case of latest models even higher. However, it is also possible for lower magnetic field strengths to also use permanent magnets or electromagnets with resistive coils.

Furthermore, the magnet unit 10 comprises gradient coils 12, which are configured to superimpose variable magnetic fields in three spatial directions on the magnetic field B0 for spatial differentiation of the detected imaging areas in the examination volume. The gradient coils 12 are usually coils of normal conducting wires, which can create mutually-orthogonal fields in the examination volume.

The magnet unit 10 also comprises a body coil 14 that is configured to radiate a RF signal into the examination volume that is supplied via a signal line, and to receive magnetic resonance signals that are emitted by the patient and pass them on via a signal line.

A control unit 20 supplies the magnet unit 10 with the different signals for the gradient coils 12 and the body coil 14 and evaluates the received signals.

Thus, the control unit 20 comprises a gradient controller 21, which is configured so as to supply the gradient coils 12 via supply lines with variable currents that provide, in a temporally coordinated manner, the desired gradient fields in the examination volume.

Furthermore, the control unit 20 comprises an RF unit 22 having a transmitter 60 (see FIG. 2) that is configured to generate an RF pulse that has a predetermined temporal course, amplitude, and spectral power distribution so as to excite a magnetic resonance of the nuclear spins in the patient. In so doing, pulse powers in the range of kilowatts can be achieved. The excitation pulses may be radiated via the body coil 14 or also via a local transmitting antenna into the patient.

A controller 23 communicates with the gradient controller 21 and the RF unit 22 via a signal bus 25.

In this case, the gradient fields are temporally changing magnetic fields that induce eddy currents by induction in nearly electrically conductive elements of the construction and, to a lesser extent, also in the electrically conductive body. Said eddy currents in turn produce magnetic fields opposite to the cause and thus locally weaken the local static magnetic field. In so doing, a magnetic field is regarded as static if spectral portions with appreciable energy, in other words for example a base signal and 2nd or 3rd harmonics, lie in a frequency range that is considerably lower than the Larmor frequency, in other words for example lower by more than the factor 10, 100, 1000, etc. These eddy currents change the Larmor frequency of nuclear spins locally in dependence upon space and time. Excitation pulses for nuclear spins that are transmitted simultaneously or immediately following gradient pulses as part of an image acquisition sequence change as a result the effect achieved, in other words the flip angle and the desired excitation is not achieved or not sufficiently achieved.

Other causes for a change in the static magnetic field are, in addition to the construction of the magnetic resonance tomography unit itself, due to the patient. This can change the magnetic field B0 due to the size and composition as a result of the magnetic properties of the body tissue. Particularly critical here are areas such as shoulder and back of neck in which different types of tissue, such as bone, muscle, tendons, and fat are close together and influence the magnetic fields due to transitions between the tissues. For instance, these influences are changed again in each patient, and even in the same patient the conditions change in each image acquisition due to the position.

In accordance with the disclosure, it is therefore proposed to adapt the excitation pulse temporally and spatially to the magnetic field changes that are brought about by the different causes, in lieu of using costly constructive measures to minimize the magnetic field changes.

FIG. 2 illustrates for this purpose schematically by way of example a transmitter 60 of an RF unit 22 (also referred to herein as RF circuitry) and as antenna or transmitting antenna a body coil 14 of a magnetic resonance tomography unit 1 in accordance with the disclosure, with which corrected excitation pulses may be radiated to achieve the desired excitation. The transmitter 60 is controller here for example by the controller 23 via a signal bus 25 with data of the excitation pulse that is to be transmitted and the temporal coordination being controlled using the gradients or the sequence.

In this case, the body coil 14 has a plurality of transmitting elements 15, which are supplied by a plurality of transmitting channels. FIG. 2 illustrates here for the sake of overview only two independent transmitting channels, which are in direct signal connection with two of the transmitting elements. The further transmitting elements are also supplied by said transmitting channels due to capacitive or inductive coupling or e.g. by separate transmitting channels. It is usually possible using such an activation of the transmitting antenna 14 to generate different elliptic polarizations with corresponding spatial amplitude distributions. With an increasing number of transmitting elements 15 that are supplied independently by different transmitting channels, the number of degrees of freedom increase to allow an adjustment of the spatial components of the field distribution more finely.

In lieu of the body coil 14, a local coil 50 having an array of antenna coils is also conceivable, for example. In this case, in contrast to the body coil 14, the effective regions of the individual antenna coils are considerably less coupled or, in the case of antenna coils that are further apart from one another, completely disjoint, with the result that the spatial distribution is provided above all due to the position of the antenna coil and less due to interference with the signals of the other antenna coils, which essentially simplifies the determination of the signals of the excitation pulse for the individual transmitting channels.

The magnetic resonance signals that are received by the local coil 50 as a receiving antenna are subsequently processed by a receiver of the RF unit 22, and therefrom a map of the patient is reconstructed by the controller 23 or a separate computer, said map being output for example on a screen. It is, however, also conceivable that the antenna or transmitting antenna is used as a receiving antenna.

FIG. 3 illustrates schematically a schematic flow chart of an exemplary embodiment of a method in accordance with the disclosure.

In a step 310, a static B0 field map of the MR scanner at least of the examination volume that is to be detected is determined. The B0 field map can be stored for example in a storage device 24 (see FIG. 2) of the controller 23 for the magnetic resonance tomography unit 1 and can be retrieved from there by the controller 23. However, retrieval from an external storage device or via a network is also conceivable.

The B0 field map can be provided for example at an early stage by simulation during the construction or by measuring using a field camera in the production process.

Additionally or alternatively, the controller 23 can measure a B0 field map prior to measuring by means of a preferably quick sequence, and said B0 field map determines the B0 changes that are brought about by the patient at least in the examination volume. It would also be possible to provide the B0 field map by simulation, where appropriate also using simplified assumptions, by the controller 23 itself.

The method may have in addition a step 315 in which a B1 field map is determined. Again, the B1 field map indicates variations in the amplitude of the radio frequency magnetic B1 alternating field which is generated when an excitation pulse is transmitted by the transmitter via the antenna. This can be caused, for example, by the geometry of the antenna or also by the interaction with the patient, for example attenuation or absorption in the body.

As noted above, the determination of the B1 field map may occur, for example, by exciting and reading a phantom in advance or also with the patient, for example by phase-sensitive mapping or by a Bloch-Siegert shift. The local field strength of the alternating magnetic field B1 can likewise be determined in the case of a known excitation pulse and known transmitting antenna geometry by means of the Maxwell equations.

In a further step 320, the controller 23 can in addition determine the gradient pulse, in other words the temporal course of the current or currents through the gradient coils, in an order in which the phase of the magnetic resonance sequence that is to be executed to generate the magnetic field gradients that are required for image acquisition. This can be performed, for example, in that the required data can be retrieved from a table in the storage device 24 of the controller 23 in dependence upon the sequence and the point in time in the sequence.

In a further step 330, the controller 23 determines the excitation that is to be achieved, in other words the flip angle that is required in accordance with the sequence for the nuclear spins that are to be excited. This can be different, depending upon whether, for example, a saturation is to be achieved (flip angle preferably approx. 110 degrees) or a spin echo (flip angle approx. 90 degrees or approx. 180 degrees). This can be performed for example in that, as in the case of the gradient pulse, the required data can be retrieved from a table in the storage device 24 of the controller 23 in dependence upon the sequence and the point in time in the sequence.

If the excitation that is to be achieved is known to the controller, the controller can, in accordance with the method, determine in a subsequent step 340 a spectrally selective, generic excitation pulse, which is designed so as to generate the excitation of the nuclear spins that is to be achieved in the patient except for local differences. The deviation with respect to the excitation that is to be achieved is then reduced in a simple optimization method (for example RMS or the actual mean value of the frequency distribution) until it meets the correct frequency, or is below a predetermined limit value in as many as possible locations. One possibility would be, for example, to perform an optimization method. The static basic value for the magnetic field B0 can be derived from the B0 field map for each location in the examination volume of the static basic value for the magnetic field B0.

Furthermore, it is also possible to take into consideration magnetic field interference caused by the patient if in one step information regarding the patient is acquired by sensors, a camera, or also by a magnetic resonance measurement. The patient can, for example, attenuate alternating fields by absorption, eddy currents can be induced in conductive tissue and organ boundaries can cause fluctuations in the permeability.

In a further step 350, a spectrally selective, dynamic excitation pulse is determined for transmission by the transmitter via the antenna in dependence upon the B0 field map. In this case, the excitation pulse is designed on the one hand so as to compensate the local differences, which result from the preceding spectrally selective, generic excitation pulse, and thus to generate the excitation of the nuclear spins that is to be achieved in the patient. On the other hand, in step 350, in addition dynamic effects are also taken into consideration, which are explained below.

The gradient field for each location in the examination volume can be determined with its temporal course by means of the Biot-Savart law from the known gradient pulse and the geometry of the gradient coils. With the knowledge regarding the design details, e.g. the arrangement of metal surfaces, the gradient fields can also be used to simulate eddy currents generated by them, and thus a dynamic component of the magnetic field B0 can also be determined for each location.

Based on the preceding spectrally selective, generic excitation pulse and starting from an excitation pulse that is assumed as the start value, the achieved flip angle is then calculated in step 350 by means of Bloch equations or Bloch simulation and the static and dynamic B0 field for each location of the examination volume. Depending upon the embodiment, in this case static deviations due to the patient and/or dynamic effects due to eddy currents are taken into consideration. The deviation with respect to the excitation that is to be achieved is then reduced in an iterative optimization method (for example LSR) until it is below a predetermined limit value.

When taking into consideration dynamic effects the optimization for different points in time relative to the course of the gradient pulses may be repeated to also take into consideration exponentially-abating eddy currents.

In this manner, a respective temporary excitation pulse is determined with amplitude, phase, and spectral distribution over different points in time for the transmitting channel or transmitting channels. It is possible by interpolation to determine therefrom a temporally changing excitation pulse having components for the individual transmitting channels.

In a step 360, the excitation pulses (e.g. the spectrally selective, generic excitation pulse and the spectrally selective, dynamic excitation pulse) and the gradient pulse are finally output in the temporal relation predetermined by the sequence and assumed during optimization.

Finally, magnetic resonance signals from the body are received by a receiver of the radio frequency unit 22 via the local coil 50 and processed for an image reconstruction by the controller 23 or a dedicated image reconstruction unit (also referred to herein as image reconstruction circuitry or image reconstruction processing circuitry).

FIG. 4 illustrates a further exemplary embodiment of the method in accordance with the disclosure in a schematic diagram, which is similar essentially to that in FIG. 3. For instance, each of the steps 410, 415, 420, 430, and 460 as shown in FIG. 4 may be similar or identical to the corresponding steps 310, 315, 320, 330, and 360 as shown and discussed herein with reference to FIG. 3.

In contrast thereto, however, the spectrally selective, generic excitation pulse and the spectrally selective, dynamic excitation pulse are determined in a common step 445. In other words, the step 445 as shown in FIG. 4 represent a combination of the steps 340 and 350 in FIG. 3. In the case of the corresponding simulation or optimization, the spectrally selective, generic excitation pulse is taken into consideration as a static component, however, may be selected or optimized in dependence upon the following spectrally selective, dynamic excitation pulse. In this case, the computational outlay that is increased in comparison to the method from FIG. 3 results in general in an improved imaging or in a reduced loading (SAR) for the patient.

Finally, it is pointed out once again that the apparatuses and methods described in detail above are exemplary embodiments, which may be modified in a wide variety of ways without departing from the scope of the disclosure. Furthermore, the use of the indefinite article "a" or "an" does not exclude that the relevant features can also be present in a plurality. Likewise, the terms "tomography unit," "system," "antenna," "transmitter," etc., do not exclude that these consist of a plurality of components which can, unless otherwise described and where appropriate, also be distributed in a spatial manner.

The various components described herein may be referred to as "units" or "apparatuses." As noted above, such components may be implemented via any suitable combination of hardware and/or software components as applicable and/or known to achieve the intended respective functionality. This may include mechanical and/or electrical components, processors, processing circuitry, or other suitable hardware components configured to execute instructions or computer programs that are stored on a suitable computer readable medium. Regardless of the particular implementation, such devices and units, as applicable and relevant, may alternatively be referred to herein as "circuitry," "processors," or "processing circuitry."

What is claimed is:

1. A method for operating a magnetic resonance imaging device, comprising:
   determining a B0 field map;
   determining an excitation of nuclear spins in a patient that is to be achieved;
   determining a spectrally selective, generic excitation pulse for transmission by a transmitter using an antenna,
   wherein the spectrally selective generic excitation pulse is based upon a B0 field map identified with a static homogeneous magnetic field B0, and is configured to generate the excitation of the nuclear spins in the patient except for local differences;
   determining a spectrally selective, dynamic excitation pulse for transmission by the transmitter using the antenna,
   wherein the spectrally selective, dynamic excitation pulse is based upon the B0 field map and is configured to compensate for the local differences and to thereby generate the excitation of the nuclear spins in the patient;
   transmitting the spectrally selective, generic excitation pulse and the spectrally selective, dynamic excitation pulse via the antenna as part of a spectrally selective excitation pulse;
   receiving, based upon the spectrally selective excitation pulse, magnetic resonance signals from a body of the patient via a receiver; and
   performing image reconstruction based upon the received magnetic resonance signals.

2. The method as claimed in claim 1, wherein the method further comprises:
   determining a B1 field map, and
   wherein determining the spectrally selective, generic excitation pulse and/or the determining the spectrally selective, dynamic excitation pulse is performed further based upon the B1 field map.

3. The method as claimed in claim 1, wherein the spectrally selective, dynamic excitation pulse is configured to achieve, as the excitation of the nuclear spins that is to be achieved, a saturation of the nuclear spins.

4. The method as claimed in claim 1, wherein the spectrally selective, dynamic excitation pulse is configured to achieve different predetermined target magnetizations for nuclear spins with at least two different Larmor frequencies.

5. The method as claimed in claim 1, wherein determining the B0 field map comprises determining the B0 field map based upon B0 deviations that are induced by the patient.

6. The method as claimed in claim 1, further comprising:
   determining a gradient pulse,
   wherein determining the B0 field map comprises determining the B0 field map based upon B0 deviations that are caused by dynamic effects as a result of gradient fields at a point in time of the spectrally selective excitation pulse, and
   wherein the spectrally selective excitation pulse transmitted during an output of the gradient pulse via the gradient coils.

7. The method as claimed in claim 1, further comprising:
   acquiring a physiological parameter of the patient,
   wherein the spectrally selective, dynamic excitation pulse is determined based upon the physiological parameter of the patient.

8. The method as claimed in claim 1, further comprising:
   performing a regional saturation via a regionally selective, generic excitation pulse and/or a regionally selective, dynamic excitation pulse.

9. The method as claimed in claim 1, wherein the spectrally selective, dynamic excitation pulse is determined based upon an analysis of the spectrally selective, generic excitation pulse via a Bloch simulation.

10. The method as claimed in claim 1, wherein the spectrally selective, generic excitation pulse and the spectrally selective, dynamic excitation pulse are determined via a common simulation.

11. A magnetic resonance imaging device, comprising:
    a field magnet configured to generate a static homogeneous magnetic field B0;
    a plurality of gradient coils configured to generate respective magnetic field gradients Gx, Gy, and Gz;
    a transmitter and an antenna configured to generate an alternating magnetic field B1 to excite nuclear spins in a patient;
    a receiving antenna and a receiver configured to receive magnetic resonance signals from the patient; and
    a controller configured to:
      provide a static B0 field map;
      provide a gradient pulse for an image acquisition sequence;
      determine an excitation of the nuclear spins that is to be achieved for the image acquisition sequence;

determine a spectrally selective, generic excitation pulse, wherein the spectrally selective generic excitation pulse is based upon a B0 field map identified with the static homogeneous magnetic field B0, and is configured to generate the excitation of the nuclear spins in the patient except for local differences;

determine a spectrally selective, dynamic excitation pulse for transmission by the transmitter via the antenna in dependence upon the B0 field map, wherein the spectrally selective, dynamic excitation pulse is based upon the B0 field map and is configured to compensate for the local differences and to thereby generate the excitation of the nuclear spins in the patient;

output the gradient pulse via the gradient coils;

transmit, via the antenna, the spectrally selective, generic excitation pulse and the spectrally selective, dynamic excitation pulse via the antenna as part of a spectrally selective excitation pulse; and perform image reconstruction based upon the magnetic resonance signals received in response to the transmission of the spectrally selective excitation pulse.

12. A non-transitory computer-readable storage medium having instructions stored thereon that, when executed by controller of a magnetic resonance imaging device, cause the magnetic resonance imaging device to:

determine a B0 field map;

determine an excitation of nuclear spins in a patient that is to be achieved;

determine a spectrally selective, generic excitation pulse for transmission by a transmitter using an antenna, wherein the spectrally selective generic excitation pulse is based upon a B0 field map identified with a static homogeneous magnetic field B0, and is configured to generate the excitation of the nuclear spins in the patient except for local differences;

determine a spectrally selective, dynamic excitation pulse for transmission by the transmitter using the antenna, wherein the spectrally selective, dynamic excitation pulse is based upon the B0 field map and is configured to compensate for the local differences and to thereby generate the excitation of the nuclear spins in the patient;

transmit the spectrally selective, generic excitation pulse and the spectrally selective, dynamic excitation pulse via the antenna as part of a spectrally selective excitation pulse;

receiving, based upon the spectrally selective excitation pulse, magnetic resonance signals from a body of the patient via a receiver; and perform image reconstruction based upon the received magnetic resonance signals.

* * * * *